(12) United States Patent
Heo et al.

(10) Patent No.: US 10,382,066 B2
(45) Date of Patent: Aug. 13, 2019

(54) METHOD AND APPARATUS FOR DECODING THREE-DIMENSIONAL TURBO PRODUCT CODE BASED ON CROSSING LAYERS

(71) Applicant: Korea University Research and Business Foundation, Seoul (KR)

(72) Inventors: Jun Heo, Seoul (KR); Byung Kyu Ahn, Seoul (KR); Sang Chul Ha, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 0 days.

(21) Appl. No.: 15/812,061

(22) Filed: Nov. 14, 2017

(65) Prior Publication Data

US 2018/0302109 A1    Oct. 18, 2018

(30) Foreign Application Priority Data

Apr. 17, 2017 (KR) .................. 10-2017-0049205

(51) Int. Cl.
| | | |
|---|---|---|
| H03M 13/29 | (2006.01) | |
| H03M 13/00 | (2006.01) | |
| H03M 13/09 | (2006.01) | |
| H03M 13/19 | (2006.01) | |
| H03M 13/45 | (2006.01) | |

(52) U.S. Cl.
CPC ..... *H03M 13/2963* (2013.01); *H03M 13/098* (2013.01); *H03M 13/19* (2013.01); *H03M 13/2918* (2013.01); *H03M 13/2939* (2013.01); *H03M 13/453* (2013.01); *H03M 13/618* (2013.01)

(58) Field of Classification Search
CPC .................................................. H03M 13/2957
USPC ......................................................... 714/755
See application file for complete search history.

(56) References Cited

U.S. PATENT DOCUMENTS

| | | | | |
|---|---|---|---|---|
| 6,906,940 B1* | 6/2005 | Lue | ......... | G11C 5/025 |
| | | | | 257/E21.614 |
| 7,656,752 B2* | 2/2010 | Arita | .......... | G04B 19/065 |
| | | | | 368/223 |
| 9,047,203 B1* | 6/2015 | Rumbolt | ........ | H03M 13/2909 |
| 2001/0050622 A1* | 12/2001 | Hewitt | .......... | H03M 13/2903 |
| | | | | 341/50 |
| 2004/0261000 A1* | 12/2004 | Hewitt | ........ | H03M 13/258 |
| | | | | 714/781 |
| 2007/0033453 A1* | 2/2007 | Azimane | .......... | G11C 29/02 |
| | | | | 714/724 |
| 2017/0155407 A1* | 6/2017 | Lin | ........ | H03M 13/152 |
| 2017/0279467 A1* | 9/2017 | Bhatia | .......... | H03M 13/152 |
| 2018/0309463 A1* | 10/2018 | Heo | ........ | H03M 13/2963 |

\* cited by examiner

*Primary Examiner* — Fritz Alphonse
(74) *Attorney, Agent, or Firm* — Fox Rothschild LLP (57) ABSTRACT

Disclosed is a three-dimensional TPC decoding apparatus. A three-dimensional TPC decoding apparatus includes an X decoder which decodes an X axis of an m-th upper half layer based on decoding results of a Y axis and a Z axis of an m−1-th upper half layer; a Y decoder which decodes a Y axis of an m-th lower half layer based on decoding results of an X axis and a Z axis of an m−1-th lower half layer; and a Z decoder which decodes a Z axis based on a decoding result of the Y axis of an m-th upper half layer and a decoding result of the X axis of an m-th lower half layer.

8 Claims, 7 Drawing Sheets

METHOD AND APPARATUS FOR DECODING THREE-DIMENSIONAL TURBO PRODUCT CODE BASED ON CROSSING LAYERS

CROSS-REFERENCE TO RELATED APPLICATIONS

This application claims the priority of Korean Patent Application No. 10-2017-0049205 filed on Apr. 17, 2017, in the Korean Intellectual Property Office, the disclosure of which is incorporated herein by reference.

BACKGROUND

Field

The present disclosure relates to a method and apparatus for decoding a three dimensional turbo product code based on crossing layers, and more particularly, to a decoding method based on crossing layers for improving a performance and a throughput of a three dimensional turbo product code and an apparatus for executing the method.

Description of the Related Art

Generally, lots of channel coding methods for searching and recovering errors generated while passing through a communication channel have been proposed. Even though various methods such as a convolutional code or a Reed-Solomon code have been proposed, the methods have disadvantages of poor performance as compared with Shannon's limit or high complexity of a decoder.

A product code was proposed by Elias in 1954 and a turbo code which exhibited a decoding performance which is close to that of Shannon's limit using a soft decision decoding algorithm and iterative decoding was proposed by Berrou et al in 1993. Thereafter, most studies are focused on a convolutional turbo code (CTC) proposed by Berrou.

In this circumstance, Pyndiah proposed a turbo product code (TPC; block turbo code) in which concepts of a turbo code, a product code, and a block code are combined in 1998. The turbo product code has characteristics such as various code rates and packet sizes and also has a performance comparable to a convolutional turbo code (CTC).

The turbo product code is a strong code in which codes having a relatively short length are multi-dimensionally combined so that a minimum distance is a product of minimum distances of individual codes. When the turbo product code is configured, the dimension is increased to improve the error correcting capability. However, in this case, the throughput is inevitably reduced. That is, the error correcting capability and throughput have trade-off relationships.

Therefore, a single parity check code is frequently applied to increase a code rate while minimizing the reduction of a throughput which is caused when the dimension expands. As a method for configuring a decoding structure of a turbo product code using a single parity code, there are a serial decoding method having an excellent decoding performance, a parallel decoding method having a good throughput, and the like.

According to the serial decoding method, individual axes are sequentially decoded to reflect a result obtained by decoding pervious axes to the iterative decoding and generate an input of a subsequent axis. In contrast, according to the parallel decoding method, individual axes are simultaneously decoded and a result obtained by decoding the individual axes is used to update an input value which will be used for decoding in a subsequent iterative decoding process. In the parallel decoding method, a result of each axis does not affect the result of other axis during the iterative decoding.

However, both the serial decoding method and the parallel decoding method have only one merit of a decoding performance and a time. That is, the serial decoding method has a low throughput, but a good error correction performance. In contrast, the parallel decoding method has an advantage in terms of a throughput due to the reduced decoding time but has a low error correction performance.

Therefore, a hybrid decoding method in which only the advantage of the serial decoding method and the advantage of the parallel decoding method are absorbed is required.

RELATED ART DOCUMENT

Patent Document

Patent Document 1: KR 2003-0023991 A "Iterative decoding method for three or higher dimensional block turbo codes" (2003 Mar. 26)

Patent Document 2: KR 10-0651473 B1 "A high speed turbo decoder using pipe-line processing" (2006 Nov. 22)

Non-Patent Document

Non-Patent Document 1: R, Pyndiah, "Near-optimum decoding of product codes: block turbo codes," IEEE Trans. Commun., vol 46, No. 8, pp. 1003-1010, August 1998.

Non-Patent Document 2: Yu, N. Y., Kim, Y., and Lee, P. J. "Iterative decoding of product codes composed of extended hamming codes," IEEE Symposium, France, pp. 732-737, July. 2000.

Non-Patent Document 3: X. Wu, Y. He, and G. Zhu, "Performance of improved three-dimensional turbo code decoder," IEEE Int. Conf. Integration Technol., Shenzhen, China, pp. 564-567, March 2007.

SUMMARY

A technical object to be achieved by the present disclosure is to provide a method and apparatus for decoding a three dimensional turbo product code based on crossing layers.

Technical objects of the present disclosure are not limited to the aforementioned technical objects and other technical objects which are not mentioned will be apparently appreciated by those skilled in the art from the following description.

A three-dimensional TPC decoding apparatus includes an X decoder which decodes an X axis of an m-th upper half layer based on decoding results of a Y axis and a Z axis of a m−1-th upper half layer, a Y decoder which decodes a Y axis of an m-th lower half layer based on decoding results of an X axis and a Z axis of an m−1-th lower half layer; and a Z decoder which decodes the Z axis based on a decoding result of the Y axis of an m-th upper half layer and a decoding result of the X axis of an m-th lower half layer.

Desirably, the X decoder decodes the X axis of the m-th lower half layer based on the decoding result of the Y axis on the m-th lower half layer.

Desirably, the Y decoder decodes the Y axis of the m-th upper half layer based on the decoding result of the X axis of the m-th upper half layer.

Desirably, the X decoder decodes the X axis of the m-th upper half layer in a parallel manner while the Y decoder decodes the Y axis of the m-th lower half layer.

Desirably, the X decoder decodes the X axis of the m-th lower half layer in a parallel manner while the Y decoder decodes the Y axis of the m-th upper half layer.

Desirably, the x decoder and the Y decoder use a chase-pyndiah algorithm.

Desirably, the Z decoder uses a normalized min-sum algorithm.

According to another aspect, a three-dimensional TPC decoding method includes dividing an upper half layer and a lower half layer with respect to a Z axis by a three-dimensional TPC decoding apparatus; primarily decoding an X axis of the upper half layer and a Y axis of the lower half layer in parallel, by the three-dimensional TPC decoding apparatus; secondarily decoding the Y axis of the upper half layer based on the decoding result of the X axis of the upper half layer and decoding the X axis of the lower half layer based on the decoding result of the Y axis of the lower half layer in parallel, by the three-dimensional TPC decoding apparatus; and decoding the Z axis based on the decoding result of the Y axis of the upper half layer and the decoding result of the X axis of the lower half layer, by the three-dimensional TPC decoding apparatus.

Desirably, the decoding method further includes: comparing a predetermined number of iterative decoding with a number of currently performed decoding, by the three-dimensional TPC decoding apparatus; and repeatedly performing the dividing, the primarily decoding, the secondarily decoding, and the decoding of the Z axis when the predetermined number of iterative decoding is larger than the number of currently performed decoding.

Desirably, the decoding method further includes comparing a predetermined number of iterative decoding with a number of currently performed decoding, by the three-dimensional TPC decoding apparatus; and performing hard decision and outputting an information value which searches an error when the predetermined number of iterative decoding is equal to the number of currently performed decoding.

According to the present disclosure, a decoding time may be reduced to be the same as the parallel decoding method while maintaining a decoding performance of a three-dimensional turbo product code to be the same as the serial decoding method. By doing this, both accuracy and throughput may be ensured.

That is, when the decoding method of the three-dimensional turbo product code proposed in the present disclosure is used, decoded parts of an X axis and a Y axis are configured in parallel during the iterative decoding process so that the throughput may be improved as compared with the serial structure of the related art. Further, a method for eliminating performance deterioration due to partial parallelization of the X axis and the Y axis may be proposed.

Technical effects of the present solution are not limited to the above-mentioned technical effects, and other technical effects, which are not mentioned above, can be clearly understood by those skilled in the art from the following descriptions.

BRIEF DESCRIPTION OF THE DRAWINGS

The above and other aspects, features and other advantages of the present disclosure will be more clearly understood from the following detailed description taken in conjunction with the accompanying drawings.

DETAILED DESCRIPTION

Those skilled in the art may make various modifications to the present invention and the present invention may have various embodiments thereof, and thus specific embodiments will be illustrated in the drawings and described in detail in detailed description. However, this does not limit the present invention within specific exemplary embodiments, and it should be understood that the present invention covers all the modifications, equivalents and replacements within the spirit and technical scope of the present invention. In the description of respective drawings, similar reference numerals designate similar elements.

Terms such as first or second, A or B may be used to describe various components but the components are not limited by the above terms. The above terms are used only to discriminate one component from the other component. For example, without departing from the scope of the present invention, a first component may be referred to as a second component, and similarly, a second component may be referred to as a first component. A term of and/or includes combination of a plurality of related elements or any one of the plurality of related elements.

It should be understood that, when it is described that an element is "coupled" or "connected" to another element, the element may be directly coupled or directly connected to the other element or coupled or connected to the other element through a third element. On the contrary, it should be understood that when an element is referred to as being "directly connected to" or "directly coupled to" another element, another element does not intervene therebetween.

Terms used in the present application are used only to describe specific exemplary embodiments, and are not intended to limit the present invention. A singular form may include a plural form if there is no clearly opposite meaning in the context. In the present invention, it should be understood that term "include" or "have" indicates that a feature, a number, a step, an operation, a component, a part or the combination thoseof described in the specification is present, but do not exclude a possibility of presence or addition of one or more other features, numbers, steps, operations, components, parts or combinations, in advance.

If it is not contrarily defined, all terms used herein including technological or scientific terms have the same meaning as those generally understood by a person with ordinary skill in the art. Terms defined in generally used dictionary shall be construed that they have meanings matching those in the context of a related art, and shall not be construed in ideal or excessively formal meanings unless they are clearly defined in the present application.

Hereinafter, exemplary embodiments according to the present disclosure will be described in detail with reference to accompanying drawings.

Figure 1:
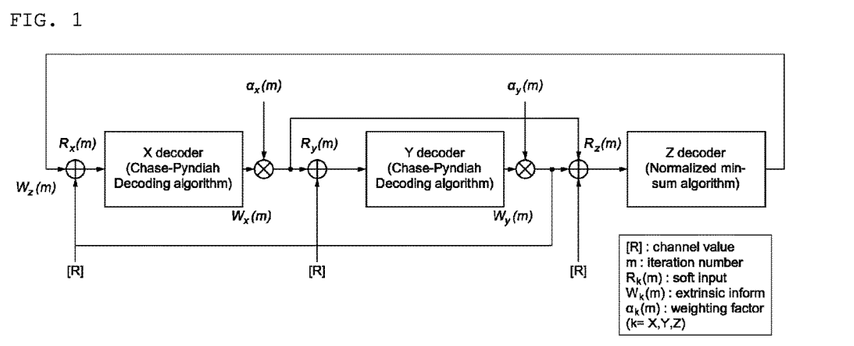
FIG. 1 is a view for explaining a iterative decoding process of a three-dimensional turbo product code by a serial decoding method of the related art.

FIG. 1 is a view for explaining a decoding process of a three-dimensional turbo product code by a conventional serial decoding method of the related art.

The serial decoding method is the simplest decoding method. According to the serial decoding method, all axes are connected in series and results of axes which have been previously decoded are reflected to update an input which is input to a decoder of a subsequent axis.

In the serial decoding method, [R] refers to reception information which passes through a channel, $R_X(m)$, $R_Y(m)$, and $R_Z(m)$ refer to soft inputs used for m-th decoding of each axis, $W_X(m)$, $W_Y(m)$, and $W_Z(m)$ refer to extrinsic information obtained as a m-th decoding result of each axis, and $\alpha_X(m)$ and $\alpha_Y(m)$ refer to weighting factors which are multiplied to extrinsic information of each axis. When all the X, Y, and Z axes are completely decoded, a number of iterative decoding times increases by one.

Referring to FIG. 1, in the serial decoding method, the X decoder is the first decoder, so that an input value is updated based on the Y axis and Z axis decoding results of the previous iterative decoding process. Further, since the Decoding of the X axis is already performed in the same iterative decoding process, an input of the Y decoder is updated by the decoding result of the X axis. In the Z decoder which is the last decoder, an input is updated based on the results of both the X axis and the Y axis in the same iterative decoding process.

In this case, the Z decoder is an axis configured by a single parity code. A performance of the Z axis may be improved using a sum-product algorithm (SPA) which is mainly used for LDPC decoding. Alternatively, instead of the sum-product algorithm a normalized min-sum method is applied to reduce implementation complexity.

Referring to FIG. 1, again, an operation of updating the soft input of each axis applied to the m-th decoding may be represented by the following Equation 1.

$$R_X(m)=[R]+\alpha_Y(m-1) \times W_Y(m-1)+W_Z(m-1)$$

$$R_Y(m)=[R]+\alpha_X(m) \times W_X(m)$$

$$R_Z(m)=[R]+\alpha_X(m) \times W_X(m)+\alpha_Y(m) \times W_Y(m) \quad \text{[Equation 1]}$$

Referring to Equation 1, the m-th soft input of the X axis is based on the m−1-th decoding results of the Y axis and the Z axis. Further, the m-th soft input of the Y axis is based on the m-th decoding result of the X axis. Further, the m-th decoding result of the Z axis is based on the m-th decoding results of the X axis and the Y axis.

The serial decoding method has a merit in that since the decoding results of other axis are reflected in one iterative decoding, an error correction performance is good. However, since the decoding of individual axes is sequentially performed, it is undesirable because the throughput is low. As described above, since a decoding time of the serial decoding method is very long, the decoding processes of the individual axes are parallelized to shorten the overall decoding time.

Figure 2:
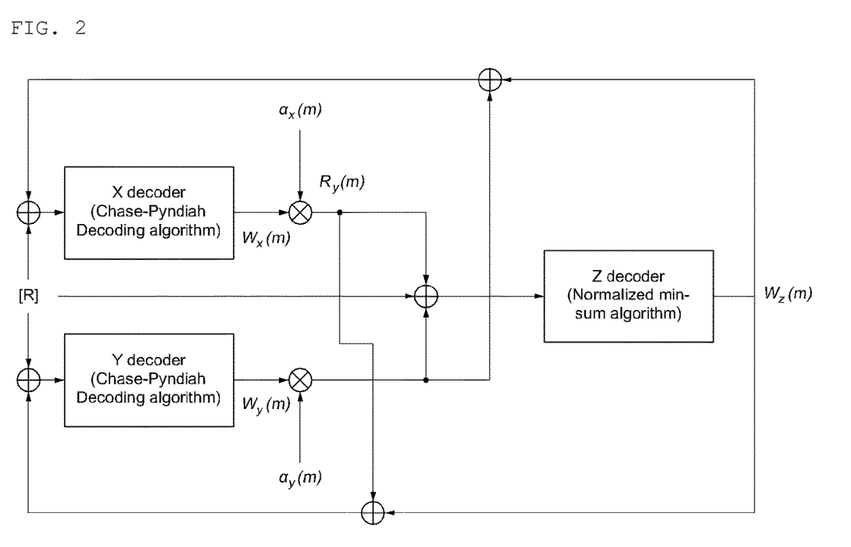
FIG. 2 is a view for explaining a iterative decoding process of a three-dimensional turbo product code by a parallel decoding method of the related art.

FIG. 2 is a view for explaining a decoding process of a three-dimensional turbo product code by a conventional parallel decoding method of the related art.

When the parallel decoding method is performed, if all the X axis, the Y axis, and the Z axis are parallelized, the performance is significantly lowered with the same iterative decoding times as the serial decoding method. Therefore, a partial parallel decoding method which parallelizes only the X axis and decoding of the Y axis and configures the Z axis in the serial manner in which the results of the X axis and the Y axis are reflected to minimize the lowering of the performance.

Referring to FIG. 2, the X axis and the Y axis are connected in parallel and the Z axis is connected in series. According to the partial parallel decoding method as described above, the X decoder updates an input based on the results of the Y axis and Z axis decoding of the previous iterative decoding process and Y decoder also updates an input based on the results of the X axis and Z axis decoding of the previous iterative decoding process. The Z decoder which is the last decoder updates the input based on the results of both the X axis and the Y axis in the same iterative decoding process.

In the partial parallel decoding method of FIG. 2, an operation of updating the soft input of each axis applied to the m-th decoding may be represented by the following Equation 2.

$$R_X(m)=[R]+\alpha_Y(m-1) \times W_Y(m-1)+W_Z(m-1)$$

$$R_Y(m)=[R]+\alpha_X(m-1) \times W_X(m-1)+W_Z(m-1)$$

$$R_Z(m)=[R]+\alpha_X(m) \times W_X(m)+\alpha_Y(m) \times W_Y(m) \quad \text{[Equation 2]}$$

Referring to Equation 2, the m-th soft input of the X axis is based on the m−1-th decoding results of the Y axis and the Z axis. Further, the m-th soft input of the Y axis is based on the m−1-th decoding results of the X axis and the Y axis. Further, the m-th decoding result of the Z axis is based on the m-th decoding results of the X axis and the Y axis.

According to the partial parallel decoding method of FIG. 2, it is advantageous that a time is saved as much as the time taken to decode the decoding of the Y axis as compared with the serial decoding method of FIG. 1 so that the throughput is increased. However, differently from the serial decoding method, the Y decoder updates the input only using the result of the previous iterative decoding like the X decoder, so that the performance is lowered as compared with the serial decoding method.

As described above, in order to achieve any one of the performance and the throughput, both the serial decoding method and the parallel decoding method of the related art may require sacrifice of the other one. Therefore, a new decoding method which may achieve both the better performance and the better throughput is required.

Figure 3:
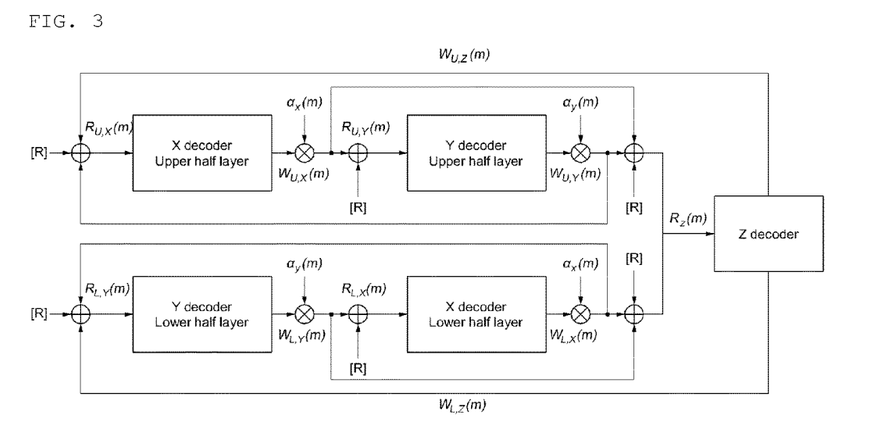
FIG. 3 is a view for explaining a iterative decoding method of a three-dimensional turbo product code.

FIG. 3 is a view for explaining a iterative decoding method of a three-dimensional turbo product code.

Referring to FIG. 3, a decoding method of a three-dimensional turbo product code proposed by the present disclosure is a decoding method in which decoding processes of an X axis and a Y axis of a three-dimensional turbo product code is performed by crossing any one layer. According to the layer crossing decoding method, the X axis and the Y axis are decoded in a serial decoding manner and are also decoded in a parallel decoding manner, simultaneously.

That is, the X axis and the Y axis are decoded in series on one layer. However, since the decoding is simultaneously performed on two layers, the decoding is performed in parallel with respect to two layers. By doing this, the same performance as the serial iterative decoding method may be achieved only during the same decoding time as the parallel iterative decoding method of the related art.

Referring to FIG. 3, first, the X decoder and the Y decoder simultaneously operate but half information thereof is decoded during a half the time used to decode both the X axis and the Y axis. That is, a code is divided into two layers with respect to the Z axis. Primarily, an upper half layer (half of the entire information) is decoded by the X decoder and a lower half layer (the remaining half information) is decoded by the Y decoder.

When decoding on the half layers is completed, the decoding result of the X axis of the upper half layer is reflected to update an input value which is input to the Y decoder and the lower half layer updates the input value of the X decoder based on the decoding result of the Y axis. That is, secondary decoding is performed.

When the decoding of the X axis and the decoding of the Y axis are completed, an input value which is input to the Z decoder is updated based on the values and then a Z axis decoding process is performed. As described above, one iterative decoding process is completed and the overall decoding process is repeatedly performed as many as the number of required repeating times.

In the layer crossing decoding method of FIG. 3, an operation of updating the soft input of each axis applied to the m-th decoding of the upper half layer may be represented by the following Equation.

In this case, the same weighting factors $\alpha_X(m)$ and $\alpha_Y(m)$ are used on the upper half layer and the lower half layer. $R_{UP,X}(m)$ and $R_{UP,Y}(m)$ refer to soft inputs of the X decoder and the Y decoder of the upper half layer used in the m-th iterative decoding. Further, $W_{UP,X}(m)$ and $W_{UP,Y}(m)$ refer to extrinsic information obtained as the decoding results of the X axis and the Y axis of the upper half layer during the m-th iterative decoding. Since the Z axis decoding is performed after combining all the layers, the extrinsic information of the m-th iterative decoding of the Z axis decoding is denoted by $W_Z(m)$.

$$R_{UP,X}(m)=[R]+\alpha_Y(m-1)\times W_{UP,Y}(m-1)+W_Z(m-1)$$

$$R_{UP,Y}(m)=[R]+\alpha_X(m)\times W_{UP,X}(m) \quad \text{[Equation 3]}$$

Referring to Equation 3, the m-th soft input of the X axis on the upper half layer is based on the m−1-th decoding results of the Y axis and the Z axis the upper half layer. Further, the m-th soft input of the Y axis of the upper half layer is based on the m-th decoding result of the X axis of the upper half layer.

In the other hand, an operation of updating the soft input of each axis applied to the m-th decoding of the lower half layer may be represented by the following Equation 4.

$$R_{DOWN,X}(m)=[R]+\alpha_Y(m)\times W_{DOWN,Y}(m)$$

$$R_{DOWN,Y}(m)=[R]+\alpha_X(m-1)\times W_{DOWN,X}(m-1)+W_Z(m-1) \quad \text{[Equation 4]}$$

Referring to Equation 4, the m-th soft input of the X axis on the lower half layer is based on the m-th decoding result of the Y axis of the lower half layer. Further, the m-th soft input of the Y axis of the lower half layer is based on the m−1-th decoding results of the X axis and the Z axis of the lower half layer.

The extrinsic information obtained after completing all the decoding of the X axis and the decoding of the Y axis is calculated to generate the soft input of the Z axis decoding. A value of the upper half layer of the soft input of the Z axis decoding is generated using the extrinsic information obtained by performing the decoding of the X axis and the decoding of the Y axis of the upper half layer and the extrinsic information obtained by performing the decoding of the X axis and the decoding of the Y axis of the lower half layer is used for the operation of a value of the lower half layer. The operation of updating the soft input of the Z axis may be represented by the following Equation 5.

$$R_{UP,Z}(m)=[R]+\alpha_X(m)\times W_{UP,X}(m)+\alpha_Y(m)\times W_{UP,Y}(m)$$

$$R_{DOWN,Z}(m)=[R]+\alpha_X(m)\times W_{DOWN,X}(m)+\alpha_Y(m)\times W_{DOWN,Y}(m) \quad \text{[Equation 5]}$$

Referring to Equation 5, the m-th soft input of the Z axis of the upper half layer is based on the m-th decoding results of the X axis and the Y axis of the upper half layer. Further, the m-th soft input of the Z axis of the lower half layer is based on the m-th decoding results of the X axis and the Y axis of the lower half layer.

As described above, when the layer crossing decoding method is used, the decoding of the X axis and the decoding of the Y axis are simultaneously performed so that the decoding may be performed for a short decoding time similarly to the existing parallel decoding method. Simultaneously, similarly to the serial decoding method in terms of the performance, as a soft input operating value which is input to decode the Z axis, the information obtained by decoding the X axis and the Y axis is input. Therefore, the error correction performance is improved.

Figure 4:
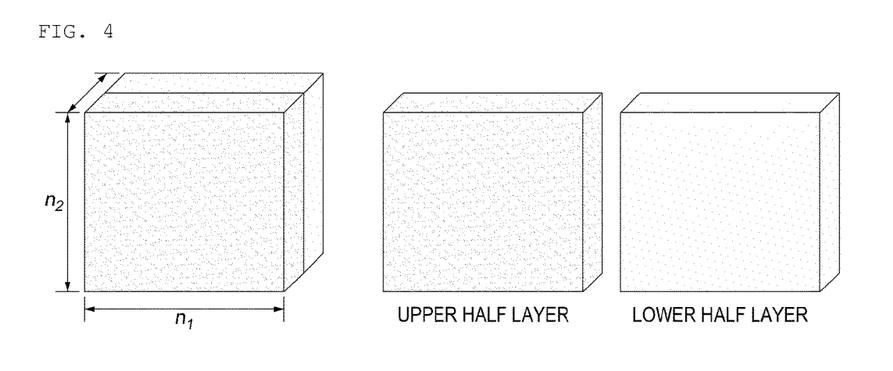
FIG. 4 is a view for explaining a concept of layer crossing iterative decoding method which may be used in scenarios of the present solution.

FIG. 4 is a view for explaining a concept of layer crossing which may be used in scenarios of the present solution.

Referring to FIG. 4, it is understood that a three-dimensional TPC configured by $(n_1, k_1)\times(n_2, k_2)\times(n_3, k_3)$ is divided into an upper half layer and a lower half layer with respect to the Z axis. In this case, a size of the Z axis on the upper half layer is equal to a size of the Z axis on the lower half layer. By doing this, the decoding on the upper half layer and the decoding on the lower half layer may be performed for the same time.

As illustrated in FIG. 4, the X decoder and the Y decoder simultaneously operate after dividing the TPC into two layers and the X decoder performs decoding from the upper half layer and the Y decoder performs decoding from the lower half layer during the same time.

Next, when the decoding on the half layers is completed, the upper half layer reflects the decoding result of the Y axis to update a soft input which is input to the X decoder and the lower half layer reflects the decoding of the X axis result to update a soft input which is input to the Y decoder. Next, the X decoder decodes the lower half layer and the Y decoder decodes the upper half layer.

When both the decoding of the X axis of the lower half layer and the decoding of the Y axis of the upper half layer are completed, the result is reflected to perform the Z axis decoding. The layer crossing serial and parallel hybrid decoding method is repeated as many as the number of iterative decoding. When the iterative decoding is completed, initial channel information value and decoding result values of the X, Y, and Z axes after completing four times of iterative decoding process are added and then hard decision is performed to output an information value.

As described above, according to the layer crossing hybrid decoding method proposed by the present disclosure, decoding of the X axis starts through upper half information and decoding of the Y axis starts with lower half information and a value reflecting the decoding result of the previous axis is used as a soft input from a point where the position of the half information crosses during the decoding of the X axis and the decoding of the Y axis to perform the decoding. Therefore, the performance and the decoding time may be simultaneously improved.

Figure 5:
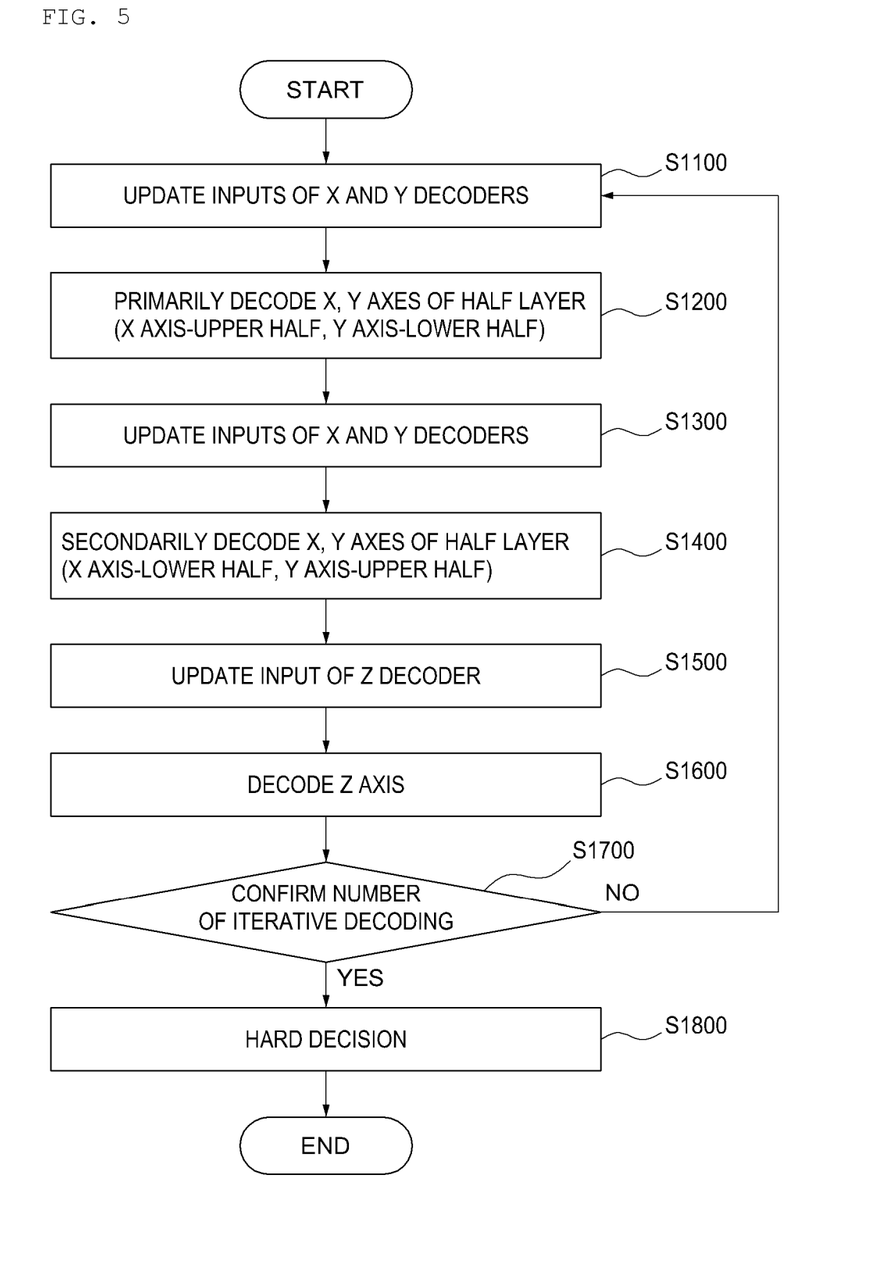
FIG. 5 is a flowchart for explaining a decoding method of a three-dimensional turbo product code.

FIG. 5 is a flowchart for explaining a decoding method of a three-dimensional turbo product code.

Referring to FIG. 5, first, inputs of an X decoder and a Y decoder are updated to perform m-th decoding (S1100). That is, the X axis of the m-th upper half layer reflects the results of the Y axis and the Z axis of the m−1-th upper half layer to update the input. Further, the Y axis of the m-th lower half layer reflects the results of the X axis and the Z axis of the m−1-th lower half layer to update the input.

Next, primarily decoding is performed in m-th iterative decoding (S1200). That is, the upper half layer is decoded with respect to the X axis and the lower half layer is decoded with respect to the Y axis. The upper half layer and the lower half layer are simultaneously decoded so that a merit of the parallel decoding method may be obtained.

Next, inputs of the X decoder and the Y decoder are updated (S1300). That is, an input of the Y axis of the m-th upper half layer is updated by reflecting a decoding result of the X axis of the m-th upper half layer performed in step S1200 and an input of the X axis of the m-th lower half layer is updated by reflecting a decoding result of the Y axis of the m-th lower half layer performed in step S1200.

Next, secondary decoding is performed in m-th iterative decoding (S1400). That is, the upper half layer is decoded with respect to the Y axis and the lower half layer is decoded with respect to the X axis. With respect to each of the upper half layer and the lower half layer, the decoding of the Y axis is performed using the result of the X axis or the decoding of the X axis is performed using the result of the Y axis, so that a merit of the serial decoding method may be obtained.

After completing the secondary decoding, an input of the Z decoder is updated to decode the Z axis (S1500). That is, an input of the Z axis of the upper half layer is updated based on the decoding results of the X axis and the Y axis of the upper half layer and an input of the Z axis of the lower half layer is updated based on the decoding results of the X axis and the Y axis of the lower half layer.

Next, the iteration number of decoding processes of a three-dimensional turbo product code is confirmed (S1700). When the m-th iteration number is not equal to a predetermined iteration number, it means that the iterative decoding which needs to be performed remains so that a sequence moves to step S1100 again. Further, when the m-th iteration number is equal to the predetermined iteration number, it means that all the iterative decoding is completed. Therefore, hard decision is performed (S1800) and the decoding process is finally completed.

Figure 6:
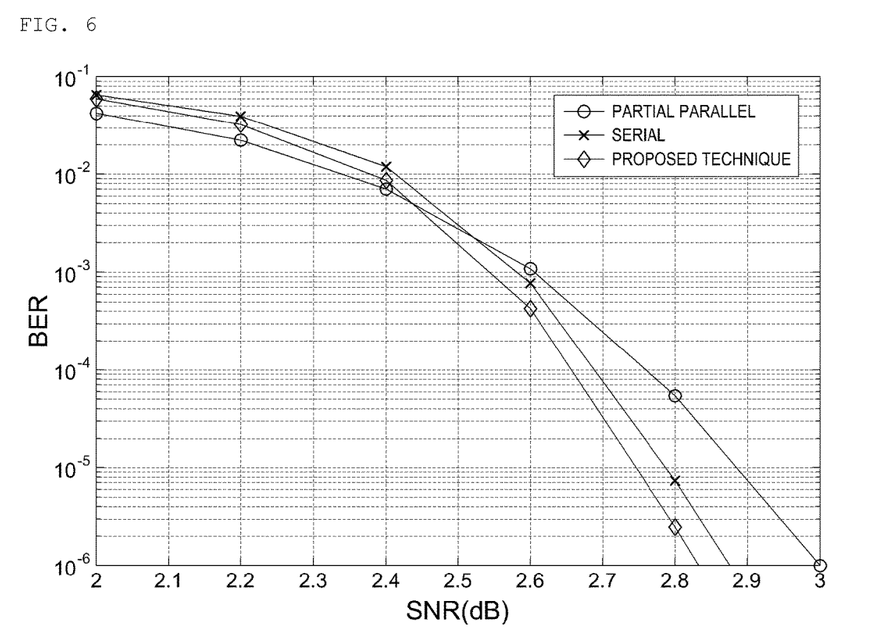
FIG. 6 is a result obtained by measuring a performance of a decoding method of a three-dimensional turbo product code.

FIG. 6 is a result obtained by measuring a performance of a decoding method of a three-dimensional turbo product code.

FIG. 6 is a BER performance curve for comparing a performance of a serial decoding method and a partial parallel decoding method which are existing decoding methods of (64,57)×(32,26)×(8,7) TPC and a performance of a layer crossing based hybrid method proposed by the present disclosure. In this case, the number of bits with least reliability and the number of iterative decoding are four, respectively. The X decoder and the Y decoder use a chase-pyndiah decoding algorithm based on an extended hamming code and the Z decoder uses a sum-product algorithm for decoding a single parity code.

Referring to FIG. 6, when the partial parallel decoding method is used, the performance may be deteriorated by approximately 0.12 dB as compared with the serial decoding method in BER 10^(−6). In contrast, it is confirmed that when the layer crossing hybrid decoding method (hybrid decoding method) proposed by the present disclosure is used, a performance similar to the serial decoding structure.

A throughput in the simulation result of FIG. 6 will be represented in the following Table 1.

TABLE 1

| Iterative decoding structure | Total decoding time (CLK) | Throughput |
|---|---|---|
| Serial decoding method | 418,976 | 3.75 Mbps |
| Partial parallel decoding method | 213,136 | 7.38 Mbps |
| Layer crossing hybrid decoding method | 254,104 | 6.2 Mbps |

Referring to Table 1, a decoding time of the layer crossing hybrid decoding method proposed by the present disclosure is not fast as much as a decoding time of the partial parallel decoding method of 213136 CLK. However, a decoding time of 254104 CLK which is 40% faster than the decoding time of the serial decoding method of 418976 CLK. When the decoding time is converted into a throughput, it is understood that the throughput is 6.2 Mbps which is similar to a throughput of the partial parallel decoding method of 7.38 Mbps.

Figure 7:
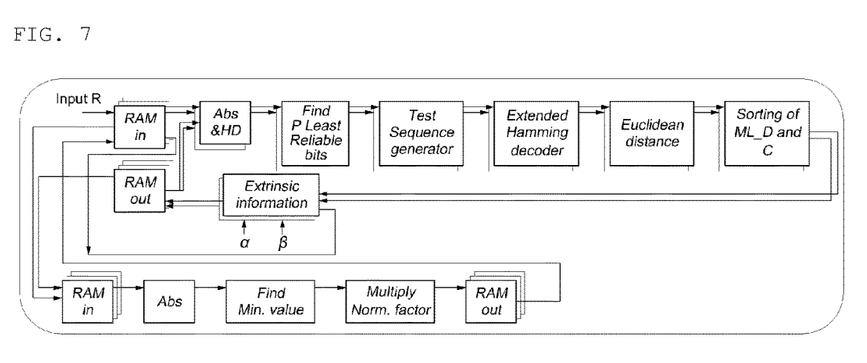
FIG. 7 is a diagram of a hardware of a decoding apparatus of a three-dimensional turbo product code.

FIG. 7 is a diagram of hardware of a decoding apparatus of a three-dimensional turbo product code.

Referring to FIG. 7, a three-dimensional turbo product code decoding apparatus proposed by the present disclosure includes two types of decoders. First, an X decoder and a Y decoder are decoders which use a chase-pyndiah decoding algorithm and a Z decoder is a decoder which uses a normalized min-sum algorithm.

When the decoding apparatus illustrated in FIG. 7 is used, a decoding time may be reduced as much as the partial parallel decoding method while maintaining a decoding performance of the three-dimensional TPC as much as the serial decoding method. That is, the decoding apparatus proposed by the present disclosure exhibits a similar performance to the serial decoding method which is focused on the decoding performance. Further, the X decoder and the Y decoder are simultaneously used so that the similar decoding time to the partial parallel decoding method may be obtained.

The exemplary embodiments of the present disclosure have been described with reference to the accompanying drawings, but those skilled in the art will understand that the present disclosure may be implemented in another specific form without changing the technical spirit or an essential feature thereof. Thus, it is to be appreciated that embodiments described above are intended to be illustrative in every sense, and not restrictive.

What is claimed is:

1. An apparatus for decoding information encoded using a three-dimensional Turbo Product Code ("TPC"), comprising:
    an upper X decoder circuit which decodes an X axis value of an m-th upper half layer based on decoding results of a Y axis and a Z axis of an m−1-th upper half layer;
    an upper Y decoder circuit that is connected in series with the upper X decoder circuit and which decodes a Y axis value of the m-th upper half based on a decoding result of the upper X decoder circuit;
    a lower Y decoder circuit that is connected in parallel with the upper X decoder circuit and which decodes a Y axis value of an m-th lower half layer based on decoding results of the X axis and the Z axis of an m−1-th lower half layer;

a lower X decoder circuit that is connected in series with the lower Y decoder circuit and which decodes an X axis value of the m-th lower half layer based on a decoding result of the lower Y decoder circuit; and a Z decoder circuit that is connected is series with the upper Y decoder circuit and the lower X decoder circuit, and which decodes a Z axis value based on a decoding result of the upper Y decoder circuit and the a decoding result of the lower X decoder circuit;

wherein the decoding results of the upper X decoder circuit, the lower X decoder circuit, the upper Y decoder circuit, the lower Y decoder circuit, and the Z decoder circuit collectively represent a decoded version of the information.

2. The apparatus according to claim 1, wherein the lower Y decoder circuit decodes the Y axis value of the m-th lower half while the upper X decoder circuit decodes the X axis value of the m-th upper half layer.

3. The apparatus according to claim 1, wherein the lower X decoder circuit decodes the X axis value of the m-th lower half while the upper Y decoder circuit decodes the Y axis value of the m-th upper half layer.

4. The apparatus according to claim 1, wherein decoded values for the X axis and the Y axis are determined using a chase-pyndiah algorithm.

5. The apparatus according to claim 1, wherein decoded values for the Z axis are determined using a normalized min-sum algorithm.

6. A method for decoding information encoded using a three-dimensional Turbo Product Code ("TPC"), comprising:

decoding, by an upper X decoder circuit, an X axis value of an m-th upper half layer based on decoding results of a Y axis and a Z axis of an m−1-th upper half layer;

decoding, by an upper Y decoder circuit, a Y axis value of the m-th upper half layer based on a decoding result of the upper X decoder circuit;

decoding, by a lower Y decoder circuit, a Y axis value of an m-th lower half layer based on decoding results of the X axis and the Z axis of an m−1-th lower half layer;

decoding, by a lower X decoder circuit, an X axis value of the m-th lower half layer based on the decoding result of the lower Y decoder circuit; and decoding, by a Z decoder circuit, a Z axis value based on a decoding result of the upper Y decoder circuit and a decoding result of the lower X decoder circuit;

wherein the upper X decoder circuit is connected in series with the upper Y decoder circuit, the upper X decoder circuit is connected in parallel in the lower Y decoder circuit, the lower Y decoder circuit is connected in series with the lower X decoder circuit, and the Z decoder circuit is connected in series with the the upper Y decoder circuit and the lower X decoder circuit; and wherein the decoding results of the upper X decoder circuit, the lower X decoder circuit, the upper Y decoder circuit, the lower Y decoder circuit, and the Z decoder circuit collectively represent a decoded version of the information.

7. The method according to claim 6, further comprising:

comparing a predetermined number of iterations for a decoding process with a number of currently performed iterations of the decoding process; and repeatedly performing the decoding process when the predetermined number is larger than the number of currently performed iterations of the decoding process.

8. The method according to claim 6, further comprising:

comparing a predetermined number of iterations for a decoding process with a number of currently performed iterations of the decoding process; and performing hard decision and outputting an information value which searches an error when the predetermined number is equal to the number of currently performed iterations of the decoding process.

* * * * *